United States Patent
Han et al.

(10) Patent No.: US 10,553,364 B2
(45) Date of Patent: Feb. 4, 2020

(54) MULTILAYER CAPACITOR INCLUDING VIA ELECTRODES AND BOARD HAVING THE SAME

(71) Applicant: SAMSUNG ELECTRO-MECHANICS CO., LTD., Suwon-si, Gyeonggi-do (KR)

(72) Inventors: Jin Ok Han, Suwon-si (KR); Jin Kyung Joo, Suwon-si (KR); Jin Ju Park, Suwon-si (KR); Jae Yeol Choi, Suwon-si (KR); Hong Seok Kim, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/595,070

(22) Filed: May 15, 2017

(65) Prior Publication Data
US 2018/0019064 A1    Jan. 18, 2018

(30) Foreign Application Priority Data
Jul. 14, 2016  (KR) ................. 10-2016-0089312

(51) Int. Cl.
*H01G 4/40*    (2006.01)
*H01G 4/232*    (2006.01)
(Continued)

(52) U.S. Cl.
CPC .............. *H01G 4/40* (2013.01); *H01G 2/06* (2013.01); *H01G 4/008* (2013.01); *H01G 4/018* (2013.01);
(Continued)

(58) Field of Classification Search
CPC .......... H01G 4/018; H01G 4/008; H01G 4/40; H01G 4/232; H01G 2/06
See application file for complete search history.

(56) References Cited

U.S. PATENT DOCUMENTS

| | | | | |
|---|---|---|---|---|
| 5,599,413 A | * | 2/1997 | Nakao | ............... H01L 21/486 156/253 |
| 5,635,669 A | * | 6/1997 | Kubota | ............... H01G 2/065 174/524 |

(Continued)

FOREIGN PATENT DOCUMENTS

| | | |
|---|---|---|
| CN | 103730254 A | 4/2014 |
| JP | 08279436 A * | 10/1996 |

(Continued)

OTHER PUBLICATIONS

Chinese Office Action dated Jul. 25, 2019 issued in Chinese Patent Application No. 201710565066.9 (with English translation).

*Primary Examiner* — David M Sinclair
(74) *Attorney, Agent, or Firm* — Morgan, Lewis & Bockius LLP

(57) ABSTRACT

A multilayer capacitor includes a capacitor body including dielectric layers, first and second internal electrodes alternately disposed, with one of the dielectric layers interposed therebetween, and first and second groove parts formed in first and second surfaces of the capacitor body opposing each other to extend in a first direction in which the dielectric layers are stacked, and contacting the first and second internal electrodes, respectively; and first and second via electrodes formed in the first and second groove parts, respectively, and electrically connected to the first and second internal electrodes, respectively.

10 Claims, 12 Drawing Sheets

(51) Int. Cl.
  *H01G 2/06*     (2006.01)
  *H01G 4/008*    (2006.01)
  *H01G 4/018*    (2006.01)
  *H01G 4/30*     (2006.01)
  *H01L 21/304*   (2006.01)

(52) U.S. Cl.
  CPC .............. *H01G 4/232* (2013.01); *H01G 4/30* (2013.01); *H01L 21/3043* (2013.01)

(56) References Cited

U.S. PATENT DOCUMENTS

| | | | |
|---|---|---|---|
| 7,913,368 B2 * | 3/2011 | Kim | H01G 2/065 29/25.03 |
| 9,236,186 B2 | 1/2016 | Ahn et al. | |
| 2001/0019176 A1 * | 9/2001 | Ahiko | H01G 4/012 257/777 |
| 2003/0030994 A1 * | 2/2003 | Takaya | H01F 5/06 361/728 |
| 2009/0126174 A1 * | 5/2009 | Hong | H01G 4/1227 29/25.42 |
| 2010/0077582 A1 * | 4/2010 | Kim | H01G 2/065 29/25.42 |
| 2013/0050987 A1 * | 2/2013 | Yang | G02F 1/133608 362/97.1 |
| 2014/0104750 A1 * | 4/2014 | Ahn | H01G 4/30 361/306.3 |
| 2014/0153155 A1 * | 6/2014 | Fujii | H01G 4/302 361/301.4 |
| 2015/0124371 A1 * | 5/2015 | Park | H01G 4/012 361/301.4 |
| 2015/0380167 A1 | 12/2015 | Lim et al. | |

FOREIGN PATENT DOCUMENTS

| | | | |
|---|---|---|---|
| JP | 09045830 A | * | 2/1997 |
| JP | 11121251 A | * | 4/1999 |
| JP | 2002289452 A | * | 10/2002 |
| JP | 2012-023752 A | | 2/2012 |
| JP | 2012227233 A | * | 11/2012 |
| JP | 2014187289 A | * | 10/2014 |
| KR | 10-2016-0000753 A | | 1/2016 |

* cited by examiner

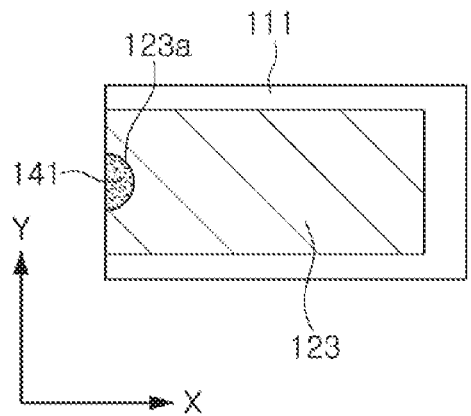
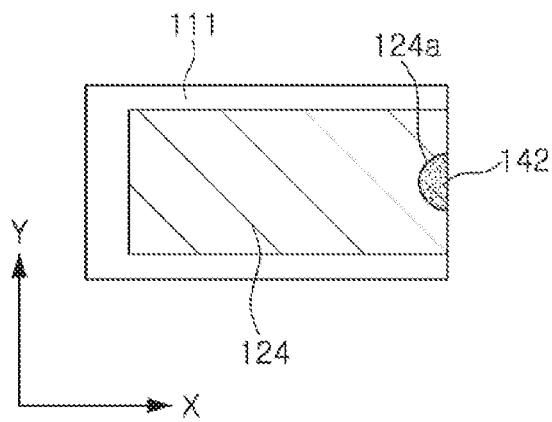
FIG. 5A  FIG. 5B
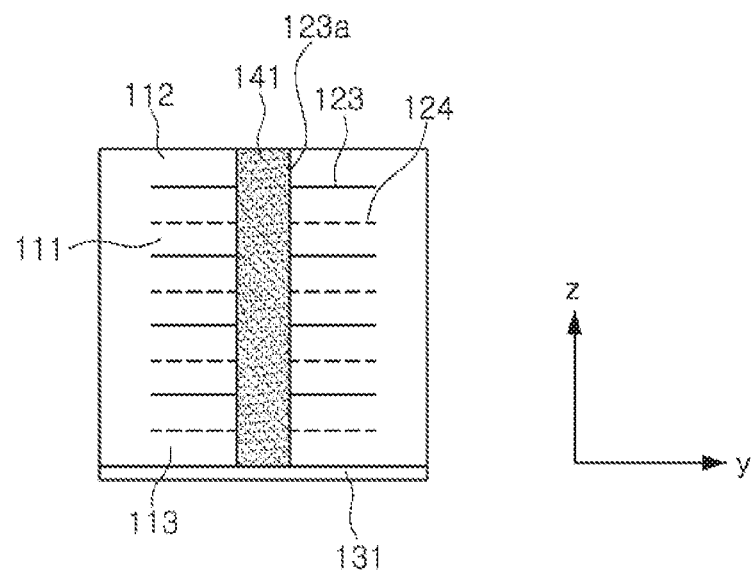
FIG. 6

MULTILAYER CAPACITOR INCLUDING VIA ELECTRODES AND BOARD HAVING THE SAME

CROSS-REFERENCE TO RELATED APPLICATION(S)

This application claims benefit of priority to Korean Patent Application No. 10-2016-0089312, filed on Jul. 14, 2016 in the Korean Intellectual Property Office, the disclosure of which is incorporated herein by reference in its entirety.

TECHNICAL FIELD

The present disclosure relates to a multilayer capacitor and a board having the same.

BACKGROUND

A multilayer capacitor, one of a variety of multilayer electronic components, is mounted on a circuit board of several electronic products, such as an image device or, for example, a liquid crystal display (LCD), a plasma display panel (PDP), and the like, a computer, a personal digital assistant (PDA), a cellular phone, and the like, to serve to charge or discharge electricity therein or therefrom.

The multilayer capacitor described above may be used as a component of various electronic devices, due to advantages such as a small size, high capacitance, and ease of mounting. Recently, a multilayer capacitor having high capacitance and high reliability has been developed.

In order to implement a high-capacitance multilayer capacitor, provided is a method of increasing permittivity of a material configuring a capacitor body or thinning thicknesses of dielectric layers and internal electrodes, to increase the number of stacked dielectric layers and internal electrodes.

However, since it is not easy to develop a composition of a high-permittivity material, and there is a limitation in decreasing the thickness of the dielectric layer in a currently known process, there is a limitation in increasing capacitance of a product using the above-mentioned method.

Therefore, in order to increase capacitance of the product, while satisfying the trend toward miniaturization of the capacitor, research into a method of increasing an overlapping area of internal electrodes having different polarities has been required.

Further, as a mounting density of a circuit board is increased, an attempt to decrease a mounting area and a mounting height of the multilayer capacitor has been conducted.

SUMMARY

An aspect of the present disclosure may provide a multilayer capacitor capable of increasing capacitance of a product while miniaturizing the product by increasing an overlapping area of internal electrodes having different polarities.

An aspect of the present disclosure may also provide a multilayer capacitor capable of decreasing a mounting area.

According to an aspect of the present disclosure, a multilayer capacitor may include: a capacitor body including dielectric layers, first and second internal electrodes alternately disposed with one of the dielectric layers interposed therebetween, and first and second groove parts formed in first and second surfaces of the capacitor body opposing each other to extend in a first direction in which the dielectric layers are stacked, and contacting the first and second internal electrodes, respectively; and first and second via electrodes formed in the first and second groove parts, respectively, and electrically connected to the first and second internal electrodes, respectively.

According to another aspect of the present disclosure, a multilayer capacitor may include: a capacitor body including dielectric layers, first and second internal electrodes including first and second body portions alternately disposed with one of the dielectric layers interposed therebetween and overlapping each other and first and second lead portions extending from the first and second body portions to be exposed to amounting surface of the capacitor body, respectively, and first and second groove parts formed to extend in a first direction in which the dielectric layers are stacked, in the mounting surface to which the first and second lead portions are exposed, and contacting the first and second lead portions, respectively; and first and second via electrodes formed in the first and second groove parts, respectively, and electrically connected to the first and second lead portions, respectively.

BRIEF DESCRIPTION OF DRAWINGS

The above and other aspects, features, and advantages of the present disclosure will be more clearly understood from the following detailed description taken in conjunction with the accompanying drawings, in which:

FIGS. 5A and 5B are plan views illustrating other examples of the first and second internal electrodes in the multilayer capacitor of FIG. 1, respectively;

FIG. 6 is a side view illustrating one side surface of the capacitor body to which the internal electrodes of FIG. 5 are applied;

DETAILED DESCRIPTION

Hereinafter, exemplary embodiments in the present disclosure will now be described in detail with reference to the accompanying drawings.

Directions of a capacitor body will be defined in order to clearly describe exemplary embodiments in the present disclosure. X, Y, and Z illustrated in the accompanying drawings refer to a length direction, a width direction, and a thickness direction, respectively. Here, the thickness direction may be the same as a stacking direction in which dielectric layers and internal electrodes are stacked.

Further, in the present exemplary embodiment, for convenience of explanation, both surfaces of a capacitor body 110 opposing each other in the Z direction will be defined as first and second surfaces S1 and S2, both surfaces of the capacitor body 110 opposing each other in the X direction and connecting ends of the first and second surfaces S1 and S2 to each other will be defined as third and fourth surfaces S3 and S4, and both surfaces of the capacitor body 110 opposing each other in the Y direction and connecting ends of the first and second surfaces S1 and S2 to each other and connecting the third and fourth surfaces S3 and S4 to each other, respectively, will be defined as fifth and sixth surfaces S5 and S6.

Multilayer Capacitor—First Exemplary Embodiment

Figure 1:
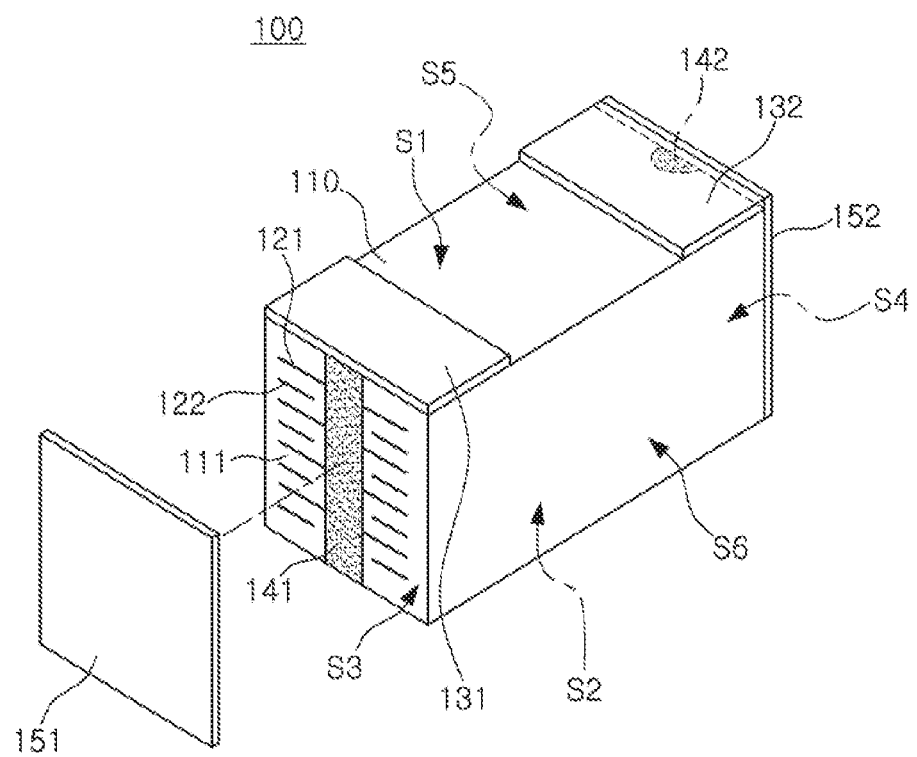
FIG. 1 is an exploded perspective view schematically illustrating a multilayer capacitor according to a first exemplary embodiment in the present disclosure in an overturned state.
Figure 1:
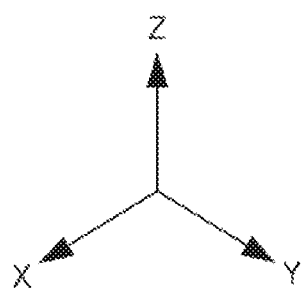
Figure 2A:
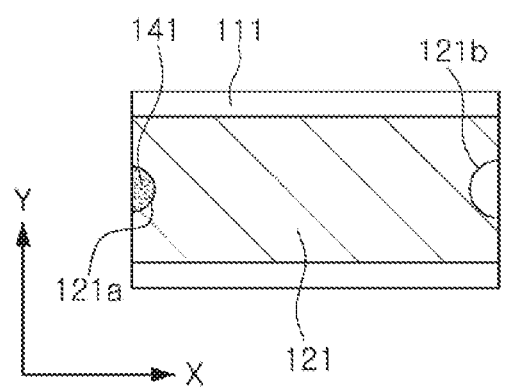
FIGS. 2A and 2B are plan views illustrating first and second internal electrodes in the multilayer capacitor of FIG. 1, respectively.
Figure 2B:
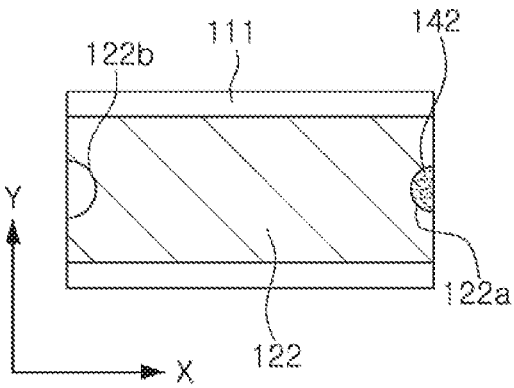
Figure 3:
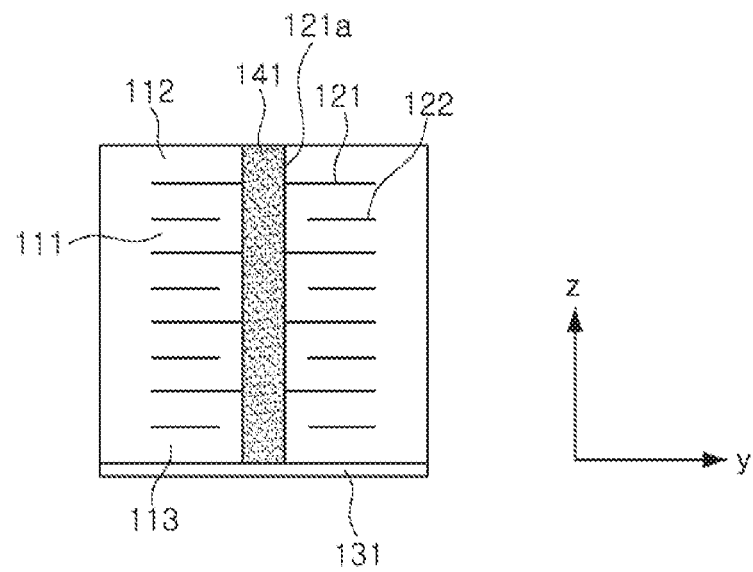
FIG. 3 is a side view illustrating one side surface of a capacitor body in FIG. 1.

FIG. 1 is an exploded perspective view schematically illustrating a multilayer capacitor according to a first exemplary embodiment in the present disclosure in an overturned state, FIGS. 2A and 2B are plan views illustrating first and second internal electrodes in the multilayer capacitor of FIG. 1, respectively, and FIG. 3 is a side view illustrating one side surface of a capacitor body in FIG. 1.

Referring to FIGS. 1 through 3, a multilayer capacitor 100 according to the first exemplary embodiment in the present disclosure may include a capacitor body 110 including dielectric layers 111, first and second internal electrodes 121 and 122, and first and second groove parts 121a and 122a, and first and second via electrodes 141 and 142.

The capacitor body 110 may be formed by stacking a plurality of dielectric layers 111, and may have a substantially hexahedral shape as illustrated in FIG. 1, but is not particularly limited thereto.

However, a shape and a dimension of the capacitor body 110 and the number of stacked dielectric layers 111 are not limited to those illustrated in the accompanying drawings.

Further, the dielectric layers 111 may be in a sintered state, and adjacent dielectric layers 111 may be integrated with each other so that boundaries therebetween are not readily apparent without a scanning electron microscope (SEM).

The capacitor body 110 as described above may include an active region including the first and second internal electrodes 121 and 122 as a part contributing to forming capacitance of the capacitor and upper and lower cover regions 112 and 113 disposed on upper and lower surfaces of the active region as margin parts.

The active region may be formed by repeatedly stacking a plurality of first and second internal electrodes 121 and 122 with one of the dielectric layers 111 interposed therebetween.

Here, a thickness of the dielectric layer 111 may be arbitrarily changed depending on a capacitance design of the multilayer capacitor 100.

In addition, the dielectric layer 111 may contain ceramic powders having high permittivity, for example, barium titanate ($BaTiO_3$) based powders or strontium titanate ($SrTiO_3$) based powders. However, a material of the dielectric layer 111 is not limited thereto.

Further, the dielectric layer 111 may further contain at least one of ceramic additives, organic solvents, plasticizers, binders, dispersants, and the like, if necessary, in addition to the ceramic powders.

The upper and lower cover regions 112 and 113 may be positioned in upper and lower portions of the capacitor body 110 in the Z direction, respectively, be formed of the same material as that of the dielectric layer 111, and have the same configuration as that of the dielectric layer 111 except that they do not include the internal electrodes.

The upper and lower cover regions 112 and 113 as described above may be prepared by stacking a single or two or more dielectric layers 111 on upper and lower portions of the active region in the Z direction, respectively, and may basically serve to prevent the first and second internal electrodes 121 and 122 from being damaged by physical or chemical stress.

The first and second internal electrodes 121 and 122 may be electrodes having different polarities from each other.

The first and second internal electrodes 121 and 122 may be alternately disposed in the capacitor body 110 with one of the dielectric layers 111 interposed therebetween in the Z direction, be formed by printing a conductive paste containing a conductive metal on the dielectric layer 111 at a predetermined thickness, and be electrically insulated from each other by the dielectric layer 111 interposed therebetween.

The conductive metal contained in the conductive paste may be, for example, nickel (Ni), copper (Cu), palladium (Pd), or an alloy thereof. However, the conductive metal contained in the conductive paste is not limited thereto.

In addition, a method of printing the conductive paste may be a screen printing method, a gravure printing method, or the like. However, the method of printing the conductive paste according to the present disclosure is not limited thereto.

The first and second internal electrodes 121 and 122 according to the present exemplary embodiment may be formed to be exposed to the third and fourth surfaces S3 and S4 of the capacitor body 110.

An overlapping area between the first and second internal electrodes 121 and 122 in the Z direction is associated with capacitance of the capacitor.

The first and second internal electrodes 121 and 122 according to the present exemplary embodiment may be exposed to the third and fourth surfaces S3 and S4 of the capacitor body 110, such that the overlapping area between the first and second internal electrodes 121 and 122 may be significantly increased.

Therefore, capacitance of the capacitor may be increased without applying a method of thinning thicknesses of dielectric layers 111 and internal electrodes to increase the number of stacked internal electrodes according to the related art, or the like.

The first groove part 121a may be formed in the third surface S3 of the capacitor body 110 to extend longitudinally in the Z direction.

Here, the first groove part 121a may be formed so that one end thereof is exposed to the first surface S1 of the capacitor body 110, and one end (left-side end in FIG. 2A) of the first internal electrode 121 in the X direction is partially removed.

The second groove part 122a may be formed in the fourth surface S4 of the capacitor body 110 to extend longitudinally in the Z direction.

Here, the second groove part 122a may be formed so that one end thereof is exposed to the first surface S1 of the capacitor body 110, and one end (right-side end in FIG. 2B) of the second internal electrode 122 in the X direction is partially removed.

Although a case in which the first and second groove parts 121a and 122a have a semi-circular shape is illustrated in the present exemplary embodiment, the shape of the first and second groove parts 121a and 122a is not limited thereto. If necessary, the first and second groove parts 121a and 122a may have various shapes such as circles, quadrangles, triangles, or the like.

The first via electrode 141 may be formed by filling the first groove part 121a with a conductive material or formed by castellation.

The first via electrode 141 may contact the end of the first internal electrode 121 corresponding to the first groove part 121a to electrically connect the plurality of first internal electrodes 121 stacked in the Z direction to each other.

Here, one end of the first via electrode 141 in the Z direction may be exposed to the first surface S1 of the capacitor body 110.

The second via electrode 142 may be formed by filling the second groove part 122a with a conductive material or formed by castellation.

The second via electrode 142 may contact the end of the second internal electrode 122 corresponding to the second groove part 122a to electrically connect the plurality of second internal electrodes 122 stacked in the Z direction to each other.

Here, one end of the second via electrode 142 in the Z direction may be exposed to the first surface S1 of the capacitor body 110.

The first and second via electrodes 141 and 142 as described above may be formed of a conductive paste containing a conductive metal.

In addition, the conductive metal may be, for example, nickel (Ni), copper (Cu), palladium (Pd), gold (Au), or an alloy thereof, but is not limited thereto.

A third groove part 121b may be formed in an end of the first internal electrode 121 contacting the fourth surface S4 of the capacitor body 110.

The third groove part 121b may be formed to be larger than the second groove part 122a at a position corresponding to the second groove part 122a.

A fourth groove part 122b may be formed in an end of the second internal electrode 122 contacting the third surface S3 of the capacitor body 110.

The fourth groove part 122b may be formed to be larger than the first groove part 121a at a position corresponding to the first groove part 121a.

Therefore, since the first via electrode 141 contacts the first internal electrodes 121 by the first groove part 121a but is spaced apart from the second internal electrodes 122 by the fourth groove part 122b, the first via electrode 141 may be electrically connected to only the plurality of first internal electrodes 121 and is not connected to the second internal electrodes 122.

Since the second via electrode 142 contacts the second internal electrodes 122 by the second groove part 122a but is spaced apart from the first internal electrodes 121 by the third groove part 121b, the second via electrode 142 may be electrically connected to only the plurality of second internal electrodes 122 and is not connected to the first internal electrodes 121.

In addition, first and second external electrodes 131 and 132 may be disposed on the first surface S1 of the capacitor body 110 to be spaced apart from each other in the X direction. Here, the first surface S1 may be the same as a mounting surface.

The first external electrode 131 may contact a portion of the first via electrode 141 exposed to the first surface S1 of the capacitor body 110 to thereby be connected thereto.

The second external electrode 132 may contact a portion of the second via electrode 142 exposed to the first surface S1 of the capacitor body 110 to thereby be connected thereto.

According to the present exemplary embodiment, since the first and second external electrodes 131 and 132 are formed on the first surface S1 of the capacitor body 110 in a substantially flat shape and thus, it is easy to allow the first and second external electrodes 131 and 132 to have a uniform thickness, size distribution of the multilayer capacitor may be decreased.

The first and second external electrodes 131 and 132 as described above may be formed by plating a conductive metal.

Further, first and second insulating layers 151 and 152 may be formed on the third and fourth surfaces S3 and S4 of the capacitor body 110.

The first and second insulating layers 151 and 152 may be formed by molding the third and fourth surfaces S3 and S4 of the capacitor body 110 with a non-conductive material, or attaching the desired number of separate ceramic sheets, or the like, on the third and fourth surfaces S3 and S4 of the capacitor body 110, but a method of forming the first and second insulating layers 151 and 152 is not limited thereto.

Here, the first and second insulating layers 151 and 152 may be formed of at least one of an insulating resin, an insulating ceramic, and an insulating resin and a filler, but a material of the first and second insulating layers 151 and 152 is not limited thereto.

The first and second insulating layers 151 and 152 as described above may serve to cover portions of the first and second internal electrodes 121 and 122 exposed to the third and fourth surfaces S3 and S4 of the capacitor body 110 and portions of the first and second via electrodes 141 and 142 exposed to the third and fourth surfaces S3 and S4 of the capacitor body 110.

Further, the first and second insulating layers 151 and 152 may improve durability of the capacitor body 110 and further secure margins having a predetermined thickness, thereby serving to improve reliability of the capacitor.

Meanwhile, since the first and second insulating layers 151 and 152 are formed after forming the capacitor body 110, in a case of significantly decreasing the thickness of the first and second insulating layers 151 and 152 in a range in which an insulation property, durability of the capacitor body, and reliability of the capacitor are maintained at a predetermined level, a size of a product may be significantly decreased.

In the multilayer capacitor 100 configured as described above, volumes of external terminals and an entire height of the capacitor may be significantly decreased, and thus, relatively, a volume and a height for increasing sizes of the internal electrodes may be further secured, such that capacitance may be further improved in accordance therewith.

Further, since a thickness of the capacitor is significantly decreased, a thin film multilayer capacitor having a thickness of 100 μm or less may be manufactured.

Modified Exemplary Embodiment

Figure 4:
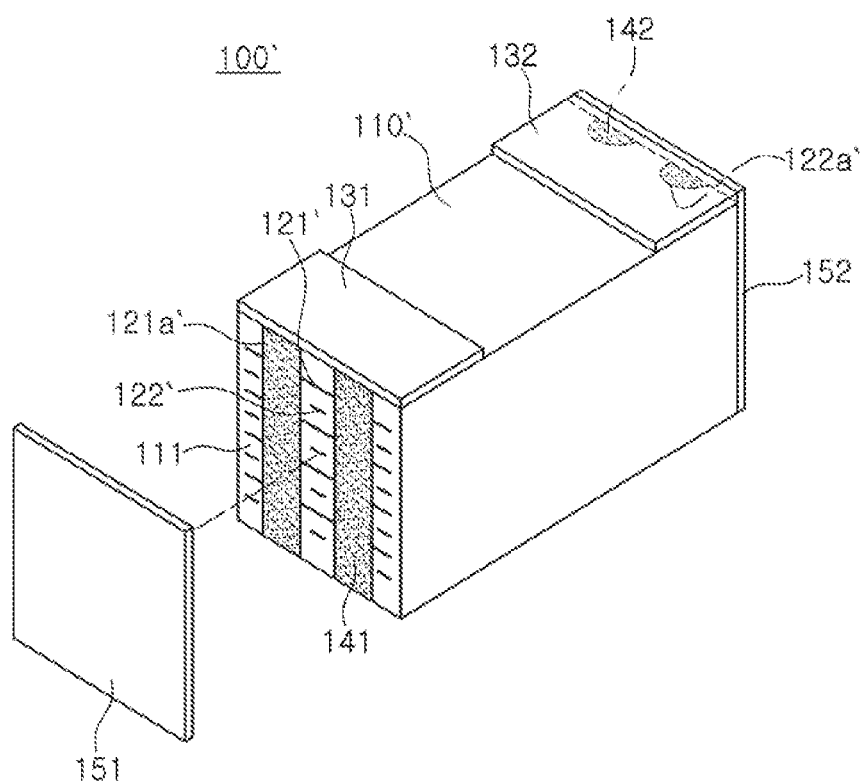
FIG. 4 is an exploded perspective view illustrating other examples of a groove part and a via electrode in the multilayer capacitor of FIG. 1.

FIG. 4 is an exploded perspective view illustrating other examples of the groove part and the via electrode in the multilayer capacitor of FIG. 1.

Here, since structures of dielectric layers 111, first and second external electrodes 131 and 132, and first and second insulating layers 151 and 152 are similar to those in the exemplary embodiment described above, a detailed description thereof will be omitted in order to avoid an overlapping description.

Referring to FIG. 4, a capacitor body 110' of a multilayer capacitor 100' may include a plurality of first and second groove parts 121a' and 122a' and a plurality of first and second via electrodes 141 and 142.

A pair of first groove parts 121a' may be formed on a third surface S3 of the capacitor body 110' to be spaced apart from each other in a Y direction of the capacitor body 110', and the first via electrode 141 may be filled in each of the first groove parts 121a' and electrically connected to first internal electrodes 121'.

A pair of second groove parts 122a' may be formed on a fourth surface S4 of the capacitor body 110' to be spaced apart from each other in the Y direction of the capacitor body 110', and the second via electrode 142 may be filled in each of the second groove parts 122a' and electrically connected to second internal electrodes 122'.

Meanwhile, although a case in which the number of each of the first and second groove parts is two is illustrated in FIG. 4, if necessary, the number of first and second groove parts may be three or more.

FIGS. 5A and 5B are plan views illustrating other examples of the first and second internal electrodes in the multilayer capacitor of FIG. 1, respectively, and FIG. 6 is a side view illustrating one side surface of the capacitor body to which the internal electrodes of FIG. 5 are applied.

Here, since structures of dielectric layers 111, first and second via electrodes 141 and 142, first and second external electrodes 131 and 132, and first and second insulating layers 151 and 152 are similar to those in the exemplary embodiment described above, a detailed description thereof will be omitted in order to avoid an overlapping description.

Referring to FIGS. 5A through 6, a first internal electrode 123 may be exposed to the third surface S3 of the capacitor body 110 and spaced apart from the fourth surface S4 of the capacitor body 110, and a second internal electrode 124 may be exposed to the fourth surface S4 of the capacitor body 110 and spaced apart from the third surface S3 of the capacitor body 110.

A first groove part 123a may be formed so that one end (left-side end in FIG. 5A) of the first internal electrode 123 in the X direction is partially removed, and a second groove part 124a may be formed so that the other end (right-side end in FIG. 5B) of the second internal electrode 124 in the X direction is partially removed.

Here, a spaced distance between an end of the first internal electrode 123 and the fourth surface S4 of the capacitor body 110 needs to be long enough to prevent the first internal electrode 123 from overlapping the second groove part 124a, and a spaced distance between an end of the second internal electrode 124 and the third surface S3 of the capacitor body 110 needs to be long enough to prevent the second internal electrode 124 from overlapping the first groove part 123a.

In addition, first and second via electrodes 141 and 142 may be formed in the first and second groove parts 123a and 124a.

Therefore, the first via electrode 141 may contact the first internal electrode 123 by the first groove part 123a but is not connected to the second internal electrode 124 in a state in which the first via electrode 141 is spaced apart from the second internal electrode 124.

The second via electrode 142 may contact the second internal electrode 124 by the second groove part 124a but is not connected to the first internal electrode 123 in a state in which the second via electrode 142 is spaced apart from the first internal electrode 123.

Figure 7A:
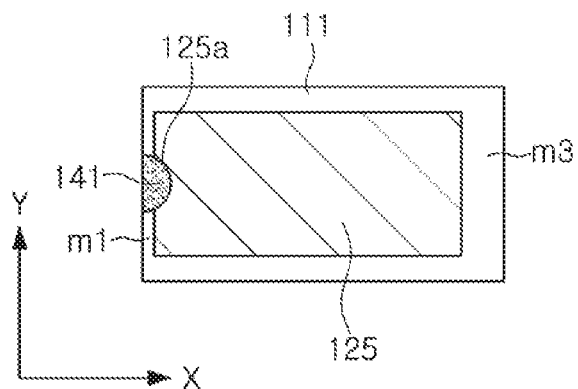
FIGS. 7A and 7B are plan views illustrating other examples of the first and second internal electrodes in the multilayer capacitor of FIG. 1, respectively.
Figure 7B:
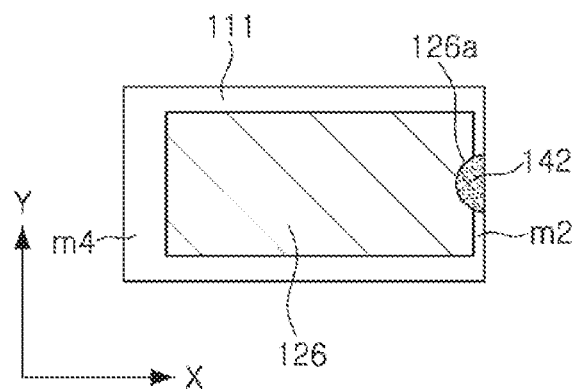
Figure 8:
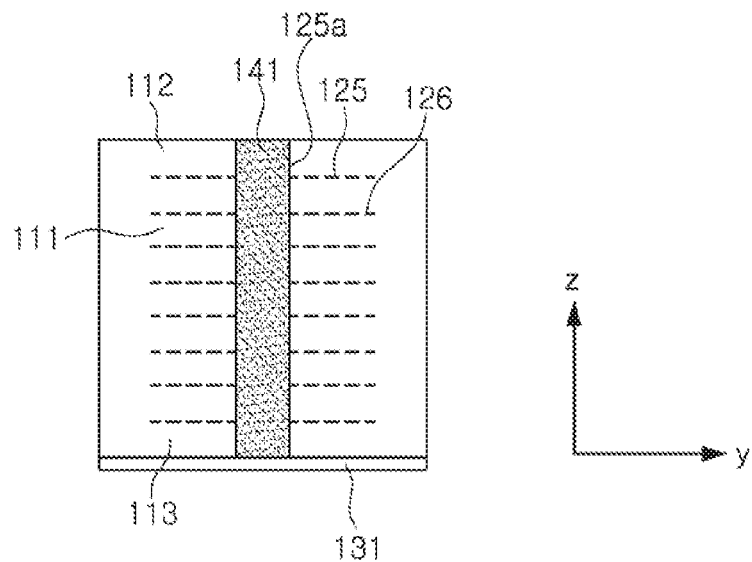
FIG. 8 is a side view illustrating one side surface of the capacitor body to which the internal electrodes of FIGS. 7A and 7B are applied.

FIGS. 7A and 7B are plan views illustrating other examples of the first and second internal electrodes in the multilayer capacitor of FIG. 1, respectively, and FIG. 8 is a side view illustrating one side surface of the capacitor body to which the internal electrodes of FIGS. 7A and 7B are applied.

Here, since structures of dielectric layers 111, first and second via electrodes 141 and 142, first and second external electrodes 131 and 132, and first and second insulating layers 151 and 152 are similar to those in the exemplary embodiment described above, a detailed description thereof will be omitted in order to avoid an overlapping description.

Referring to FIGS. 7A through 8, first and second internal electrodes 125 and 126 may be spaced apart from the third and fourth surfaces S3 and S4 of the capacitor body 110.

A spaced distance m3 between an end of the first internal electrode 125 and the fourth surface S4 of the capacitor body 110 facing each other in the X direction may be larger than a spaced distance m1 between an end of the first internal electrode 125 and the third surfaces S3 of the capacitor body 110 facing each other in the X direction.

A spaced distance m4 between an end of the second internal electrode 126 and the third surface S3 of the capacitor body 110 facing each other in the X direction may be larger than a spaced distance m2 between an end of the second internal electrode 125 and the fourth surfaces S4 of the capacitor body 110 facing each other in the X direction.

A first groove part 125a may be formed so that one end (left-side end in FIG. 7A) of the first internal electrode 125 in the X direction is partially removed, and a second groove part 126a may be formed so that on the other end (right-side end in FIG. 7B) of the second internal electrode 126 in the X direction is partially removed.

Here, the spaced distance m3 between the end of the first internal electrode 125 and the fourth surface S4 of the capacitor body 110 needs to be long enough to prevent the first internal electrode 126 from overlapping the second groove part 126a, and the spaced distance m4 between the end of the second internal electrode 126 and the third surface S3 of the capacitor body 110 needs to be long enough to prevent the second internal electrode 124 from overlapping the first groove part 125a.

In addition, first and second via electrodes 141 and 142 may be formed in the first and second groove parts 125a and 126a.

Therefore, the first via electrode 141 may contact the first internal electrode 125 by the first groove part 125a but is not connected to the second internal electrode 126 in a state in which the first via electrode 141 is spaced apart from the second internal electrode 126.

The second via electrode 142 may contact the second internal electrode 126 by the second groove part 126a but is not connected to the first internal electrode 125 in a state in which the second via electrode 142 is spaced apart from the first internal electrode 125.

According to the present exemplary embodiment, the internal electrodes may be disposed at positions spaced inwardly of the capacitor body, such that an effect of preventing cracks and delamination mainly occurring in ends of the capacitor body may be improved.

Multilayer Capacitor—Second Exemplary Embodiment

Figure 9:
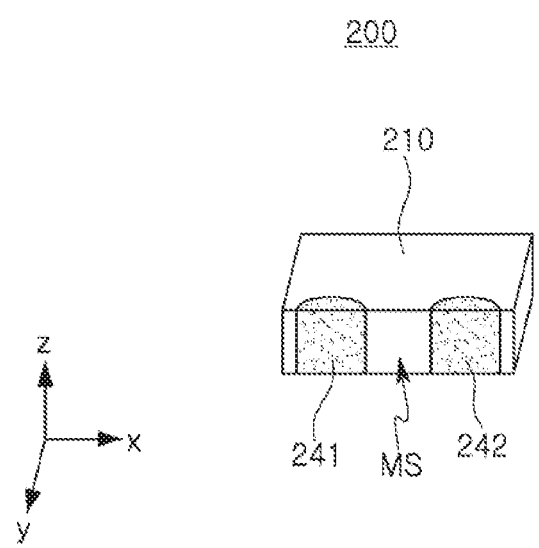
FIG. 9 is a perspective view schematically illustrating a multilayer capacitor according to a second exemplary embodiment in the present disclosure.
Figure 10A:
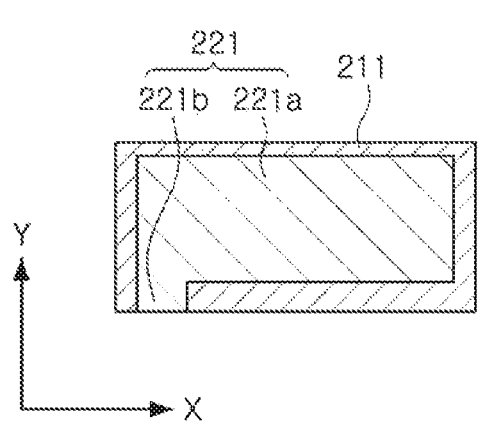
FIGS. 10A and 10B are plan views illustrating the first and second internal electrodes before first and second groove parts are formed in the multilayer capacitor of FIG. 9, respectively.
Figure 10B:
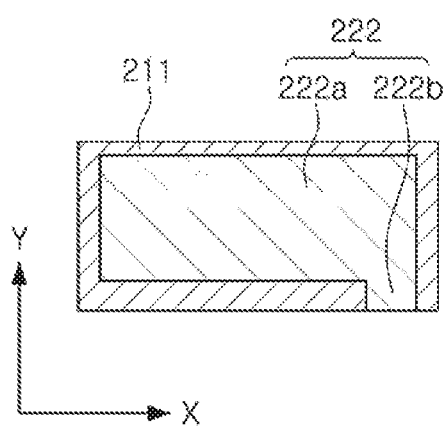
Figure 11:
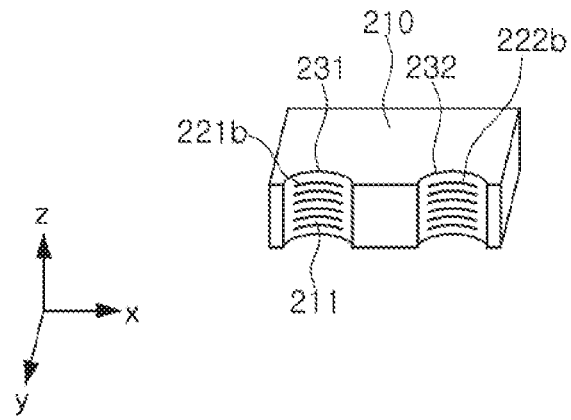
FIG. 11 is a perspective view illustrating a capacitor body of FIG. 9 in a state in which first and second via electrodes are excluded.

FIG. 9 is a perspective view schematically illustrating a multilayer capacitor according to a second exemplary embodiment in the present disclosure, FIGS. 10A and 10B are plan views illustrating the first and second internal electrodes before first and second groove parts are formed in the multilayer capacitor of FIG. 9, respectively, and FIG. 11 is a perspective view illustrating a capacitor body of FIG. 9 in a state in which first and second via electrodes are excluded.

Hereinafter, a detailed description of portions similar to those in the first exemplary embodiment described above will be omitted in order to avoid an overlapping description.

Further, in the present exemplary embodiment, for convenience of explanation, one surface MS (a front surface in FIG. 9) of a capacitor body 210 in a Y direction is defined as a mounting surface.

Referring to FIGS. 9 through 11, a multilayer capacitor 200 according to the second exemplary embodiment may include the capacitor body 210 including dielectric layers 211, first and second internal electrodes 221 and 222, and first and second groove parts 231 and 232, and first and second via electrodes 241 and 242.

The first internal electrode 221 may include a first body portion 221a and a first lead portion 221b extending from the first body portion 221a to be exposed to the mounting surface MS of the capacitor body 210. The second internal electrode 222 may include a second body portion 222a overlapping the first body portion 221a and a second lead portion 222b extending from the second body portion 222a to be exposed to the mounting surface MS of the capacitor body 210. Here, the first and second lead portions 221b and 222b may be spaced apart from each other in an X direction.

The first groove part 231 may be formed in the mounting surface MS of the capacitor body 210 to extend longitudinally in a Z direction.

Here, the first groove part 231 may be formed so that the first lead portion 221b is partially removed.

The second groove part 232 may be formed at a position spaced apart from the first groove part 231 in the X direction in the mounting surface MS of the capacitor body 210 to extend longitudinally in the Z direction.

Here, the second groove part 232 may be formed so that the second lead portion 222b is partially removed.

Although a case in which cross sections of the first and second groove parts 231 and 232 have a semi-circular shape is illustrated and described in the present exemplary embodiment, the cross-sectional shape of the first and second groove parts 231 and 232 is not limited thereto. If necessary, the cross-sections of the first and second groove parts 231 and 232 may have various shapes such as circles, quadrangles, triangles, or the like.

The first via electrode 241 may be formed by filling the first groove part 231 with a conductive material or formed by castellation.

Therefore, the first via electrode 241 may contact cut portions of the first lead portions 221b corresponding to the first groove part 231 to electrically connect a plurality of first internal electrodes 221 stacked in the Z direction to each other.

The second via electrode 242 may be formed by filling the second groove part 232 with a conductive material or formed by castellation.

Therefore, the second via electrode 242 may contact cut portions of the second lead portions 222b corresponding to the second groove part 232 to electrically connect a plurality of second internal electrodes 222 stacked in the Z direction to each other.

According to the present exemplary embodiment, both of the first and second lead portions 221b and 222b may be exposed to the mounting surface MS of the capacitor body 210, and the first and second via electrodes 241 and 242 exposed to the mounting surface MS of the capacitor body 210 may serve as external terminals mounted on a circuit board.

That is, the multilayer capacitor according to the present exemplary embodiment may have a lower surface mounting structure, such that inductance of the multilayer capacitor 200 may be decreased by decreasing a current path at the time of applying a voltage thereto.

Figure 12:
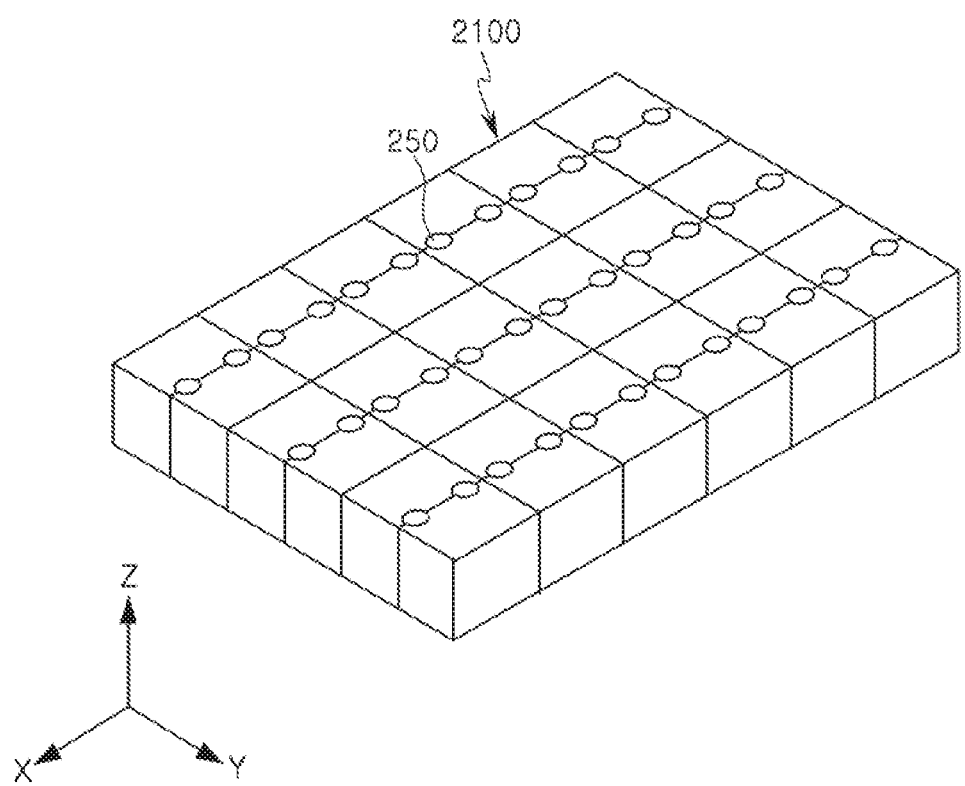
FIGS. 12 through 14 are a perspective view and cross-sectional views illustrating some of processes of manufacturing the multilayer capacitor of FIG. 9.
Figure 13:
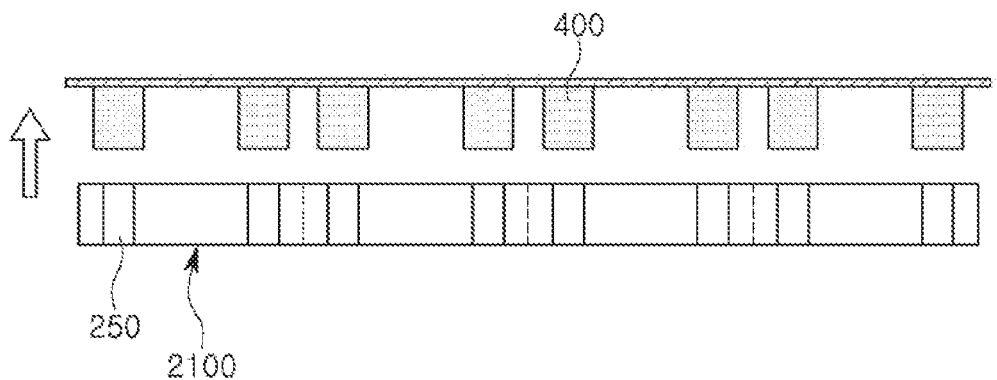
Figure 14:
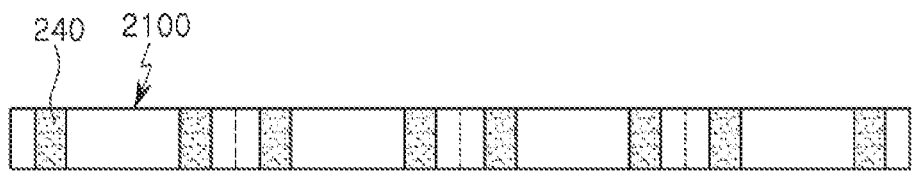

FIGS. 12 through 14 are a perspective view and cross-sectional views illustrating some of processes of manufacturing the multilayer capacitor of FIG. 9.

Hereinafter, a method of manufacturing the multilayer capacitor according to the present exemplary embodiment will be described with reference to FIGS. 12 through 14.

First, a plurality of first and second ceramic sheets may be prepared.

Next, first and second internal electrodes may be formed by printing a conductive paste on one surfaces of the first and second ceramic sheets at a predetermined thickness, respectively.

The first and second internal electrodes may have first and second body portions and first and second lead portions perpendicularly extending from the first and second body portions in the same direction with each other, respectively.

Then, the plurality of first and second ceramic sheets on which the first and second internal electrodes are formed, respectively, may be alternately stacked and pressed in a Z direction, such that a bar shaped multilayer body may be prepared.

Here, the first and second ceramic sheets may be stacked so that the first and second lead portions do not overlap each other in the Z direction.

Then, punching may be performed on the multilayer body at a predetermined interval.

Here, punching positions may be points corresponding to portions to which the first and second lead portions are led at the time of cutting the multilayer body into individual chips.

Therefore, a multilayer body 2100 having a plurality of holes 250 to which the first and second lead portions are alternately exposed as illustrated in FIG. 12 may be prepared.

Next, as illustrated in FIGS. 13 and 14, a multilayer body 2100 in which a plurality of vias 240 are formed may be prepared by filling the holes 250 of the multilayer body 2100 with a casting film 400 formed of a conductive material using a pressure.

In this case, the via 240 may be processed so as not to protrude toward upper and lower surfaces of the multilayer body 2100, thereby preventing a size of a capacitor body from being increased due to volumes of vias protruding outwardly after manufacturing the capacitor.

Thereafter, the multilayer body 2100 may be cut per region corresponding to each multilayer capacitor to thereby be manufactured in a chip form, followed by sintering, such that multilayer capacitors having first and second via electrodes may be completed.

Modified Exemplary Embodiment

Figure 15:
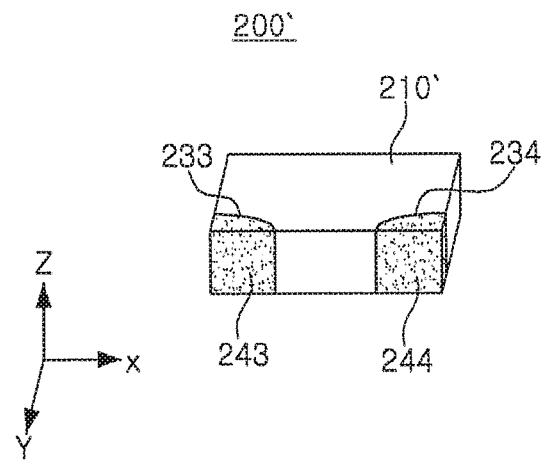
FIG. 15 is a perspective view illustrating other examples of first and second via electrodes in the multilayer capacitor according to the second exemplary embodiment in the present disclosure.
Figure 16:
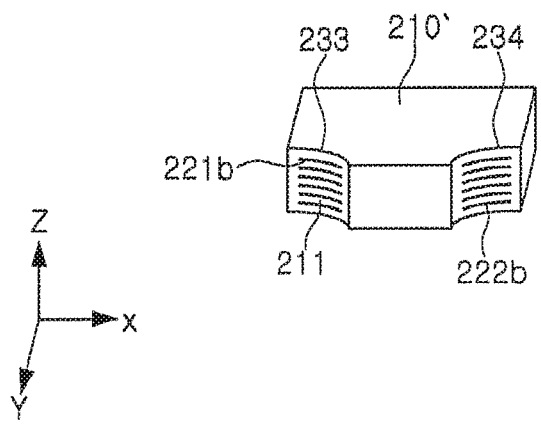
FIG. 16 is a perspective view illustrating a capacitor body of FIG. 15 in a state in which the first and second via electrodes are excluded.

FIG. 15 is a perspective view illustrating other examples of first and second via electrodes in the multilayer capacitor according to the second exemplary embodiment in the present disclosure, and FIG. 16 is a perspective view illustrating a capacitor body of FIG. 15 in a state in which the first and second via electrodes are excluded.

Here, since structures of dielectric layers 211 and first and second internal electrodes 221 and 222 are similar to those in the second exemplary embodiment described above, a detailed description thereof will be omitted in order to avoid an overlapping description.

Referring to FIGS. 15 and 16, a first groove part 233 of a multilayer capacitor 200' may be formed so that one corner (left corner in FIGS. 15 and 16) of a capacitor body 210' in an X direction is removed, and a second groove part 234 may be formed so that the other corner (right corner in FIGS. 15 and 16) of the capacitor body 210' in the X direction is removed. In addition, first and second via electrodes 243 and 244 may be formed by filling the first and second groove parts 233 and 234 with a conductive material or formed by castellation.

Figure 17:
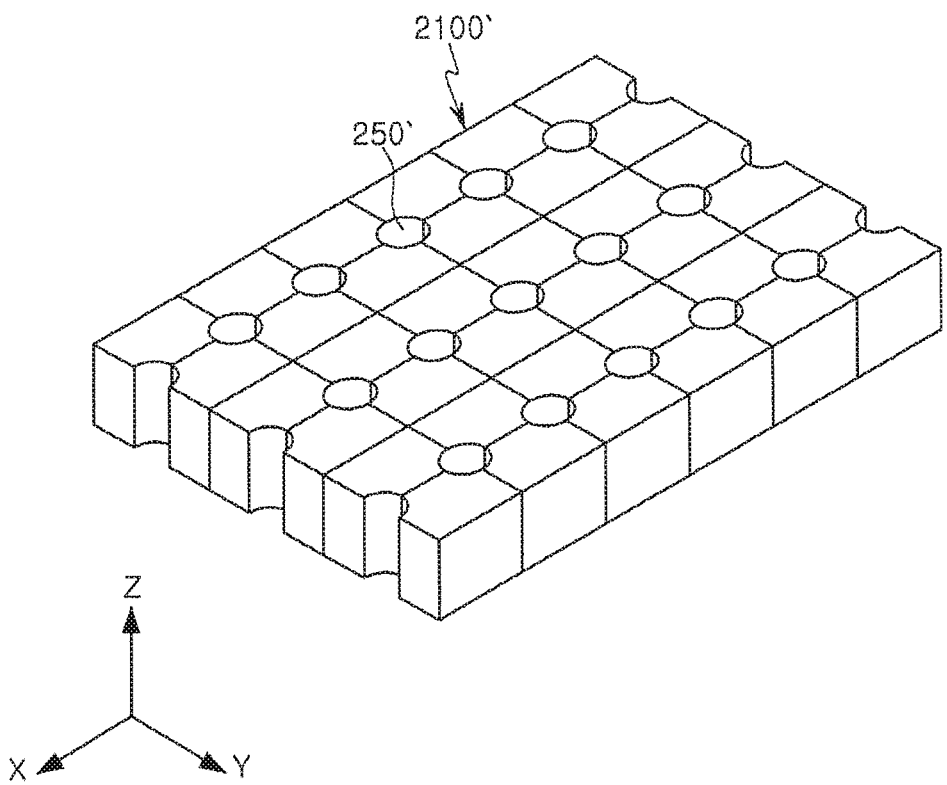
FIG. 17 is a perspective view illustrating some of processes of manufacturing the multilayer capacitor of FIG. 15.

Meanwhile, FIG. 17 is a perspective view illustrating some of processes of manufacturing the multilayer capacitor of FIG. 15. Referring to FIG. 17, in the present exemplary embodiment, at the time of punching the multilayer body 2100', positions at which holes 250' are formed in the multilayer body 2100' may be portions which will become corner portions of capacitor bodies adjacent to positions of the capacitor bodies to which first and second lead portions are led at the time of cutting the multilayer body 2100' into individual chips.

Board Having Multilayer Capacitor

Figure 18:
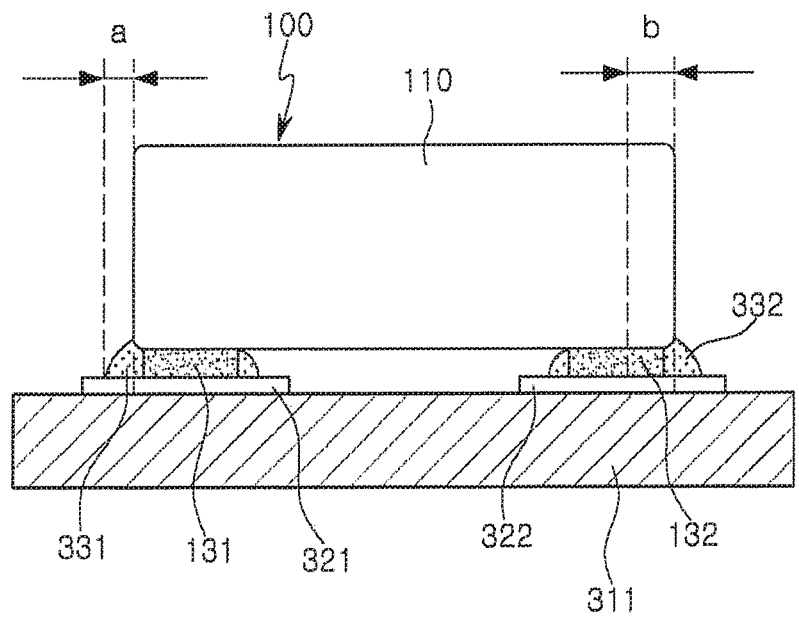
FIG. 18 is a cross-sectional view illustrating a board in which the multilayer capacitor of FIG. 1 is mounted on a circuit board.

Referring to FIG. 18, a board having a multilayer capacitor according to the present exemplary embodiment may include a circuit board 311 on which the multilayer capacitor 100 is mounted, and first and second electrode pads 321 and 322 disposed on an upper surface of the circuit board 311 to be spaced apart from each other.

The multilayer capacitor 100 may be fixed and electrically connected to the circuit board 311 by solders 331 and 332 in a state in which the first and second external electrodes 131 and 132 are positioned to contact the first and second electrode pads 321 and 322, respectively.

Since in the board having a multilayer capacitor as described above, the first and second external electrodes 131 and 132 of the multilayer capacitor 100 are exposed only to the mounting surface of the capacitor body 110, a formation area a of the solders 331 and 332 at the time of mounting the multilayer capacitor on the circuit board 211 may be significantly decreased.

In a case in which the formation area a of the solders 331 and 332 is decreased as described above, acoustic noise may be decreased, and when the mounting area is the same as that of a capacitor according to the related art, a size of the multilayer capacitor may be increased by further securing a size corresponding to b as compared to the capacitor according to the related art, capacitance of the capacitor may be relatively increased.

Figure 19:
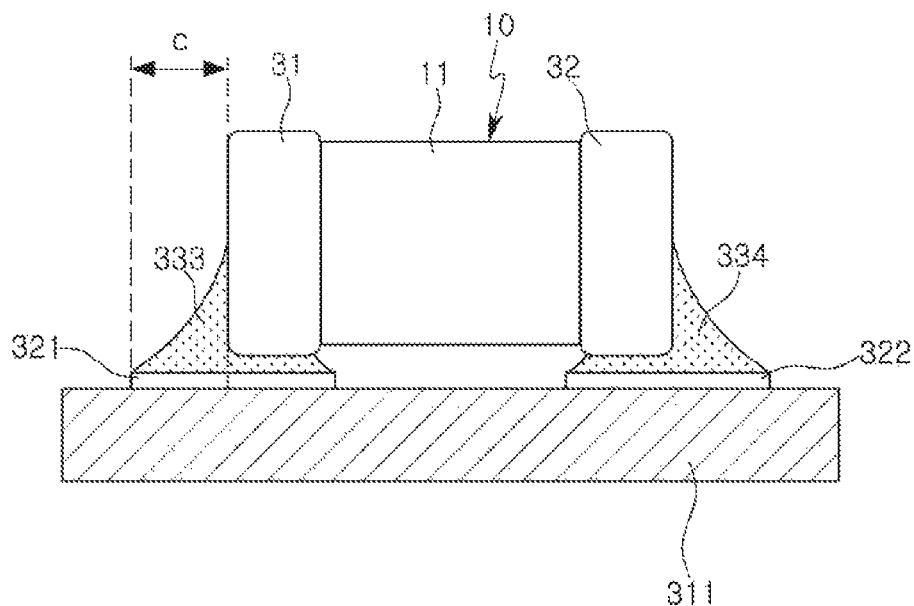
FIG. 19 is a cross-sectional view illustrating a board in which a 2-terminal capacitor according to the related art is mounted on a circuit board.

Referring to FIG. 19, in a 2-terminal multilayer capacitor 10 according to the related art, first and second external electrodes 31 and 33 enclose both end portions of a capacitor body 11, such that a formation area c of solders 333 and 334 at the time of mounting the 2-terminal multilayer capacitor 10 on a circuit board 311 may be relatively increased as compared to the formation area a of the solders 331 and 332 of the capacitor of FIG. 18.

When the formation area c of the solders 333 and 334 is increased as described above, acoustic noise may be increased. On the other hand, when a mounting area is the same as that of the capacitor of FIG. 18, since a relatively larger formation area of the solders may be required as compared to the capacitor of FIG. 18, a size of the multilayer capacitor may be decreased as compared to that of the capacitor of FIG. 18, such that capacitance of the capacitor may be relatively decreased.

In addition, the multilayer capacitor 100 according to the present exemplary embodiment may have the lower surface mounting structure, such that acoustic noise may be decreased.

Figure 20:
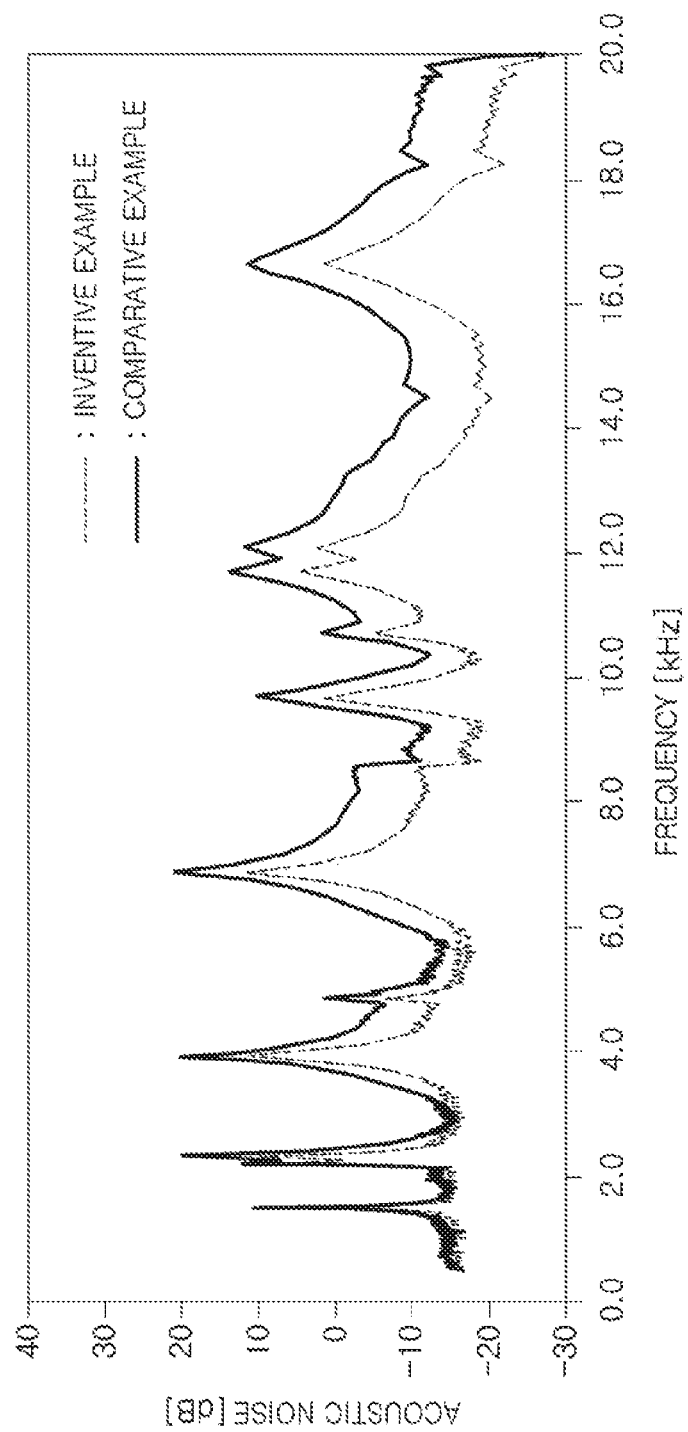
FIG. 20 is a graph illustrating a result obtained by comparing acoustic noise in a 2-terminal capacitor according to the related art and a capacitor having a structure in which a lower surface of a capacitor body is a mounting surface.

FIG. 20 is a graph illustrating a result obtained by comparing acoustic noise in a 2-terminal capacitor according to the related art and a capacitor having a structure in which a lower surface of a capacitor body is a mounting surface (hereinafter, referred to as a lower surface mounting structure).

In FIG. 20, Comparative Example indicates acoustic noise of the 2-terminal capacitor illustrated in FIG. 19, and Inventive Example indicates acoustic noise of the multilayer capacitor having the lower surface mounting structure, illustrated in FIG. 18.

Referring to FIG. 20, it may be confirmed that in Inventive Example, acoustic noise is decreased at all frequencies as compared to Comparative Example.

Meanwhile, although the board in which the multilayer capacitor of FIG. 1 is mounted on the circuit board is illustrated in FIG. 18, the board is not limited thereto. That is, the capacitor illustrated in FIG. 9 or 15 may also be mounted on the circuit board in a similar structure, thereby configuring a board having a multilayer capacitor.

As set forth above, according to exemplary embodiments in the present disclosure, since the first and second internal electrodes are electrically connected to each other through the second and first via electrodes formed along the stacking direction of the dielectric layers, the overlapping area between the internal electrodes having different polarities may be increased, such that capacitance of the product may be increased without increasing the number of stacked dielectric layers while thinning the thicknesses of the dielectric layers and the internal electrodes, or increasing permittivity.

Further, since the external terminals are disposed only on the mounting surface of the capacitor body, at the time of mounting the multilayer capacitor on the circuit board, a contact area with the solder may be decreased, such that the mounting area may be decreased.

While exemplary embodiments have been shown and described above, it will be apparent to those skilled in the art that modifications and variations could be made without departing from the scope of the present invention as defined by the appended claims.

What is claimed is:

1. A multilayer capacitor comprising:
a capacitor body including dielectric layers, first and second internal electrodes alternately disposed in a thickness direction of the capacitor body, with one of the dielectric layers interposed therebetween, and first and second groove parts having a semi-cylindrical shape recessed from first and second surfaces of the capacitor body opposing each other in a length direction of the capacitor body, respectively, the first and second internal electrodes exposed by the first and second groove parts, respectively;
first and second via electrodes disposed in the first and second groove parts, respectively, and connected to the first and second internal electrodes, respectively;
first and second external electrodes disposed on only one of third and fourth surfaces of the capacitor body in the thickness direction, and connected to the first and second via electrodes, respectively; and
a first insulating layer being in direct contact with the first surface, and a second insulating layer being in direct contact with the second surface,
wherein each of the first and second via electrodes is exposed from the third and fourth surfaces of the capacitor body,
the first insulating layer is in direct contact with the first via electrode through only a single flat side surface of the first via electrode, and the second insulating layer is in direct contact with the second via electrode through only a single flat side surface of the second via electrode,
each of the first internal electrodes is exposed from the first surface of the capacitor body, and is spaced apart from the second surface of the capacitor body and the second via electrode,
each of the second internal electrodes is exposed from the second surface of the capacitor body, and is spaced apart from the first surface of the capacitor body and the first via electrode,
a first end of each of the first internal electrodes facing the first surface has a first recess by the first groove part, and
a second end of each of the second internal electrodes facing the second surface has a second recess by the second groove part.

2. The multilayer capacitor of claim 1, wherein the capacitor body further comprises third and fourth groove parts recessed from the first and second surfaces of the capacitor body, respectively, the first and second internal electrodes also exposed by the third and fourth groove parts, respectively, the multilayer capacitor further comprises third and fourth via electrodes disposed in the third and fourth groove parts, respectively, and connected to the first and second internal electrodes, respectively,
the first and second external electrodes are connected to the third and fourth via electrodes, respectively, and
the first insulating layer covers a side surface of the third via electrode, and the second insulating layer covers a side surface of the fourth via electrode.

3. The multilayer capacitor of claim 1, wherein
a third end of each of the first internal electrodes opposing the first end thereof in the length direction has a third recess spaced apart from the second groove part, and
a fourth end of each of the second internal electrodes opposing the second end thereof in the length direction has a fourth recess spaced apart from the first groove part.

4. A board having a multilayer capacitor, the board comprising:
a circuit board having an upper surface on which first and second electrode pads are disposed; and
the multilayer capacitor of claim 1, mounted on the circuit board.

5. A multilayer capacitor comprising:
a capacitor body including:
dielectric layers,
first and second internal electrodes including first and second body portions alternately disposed in a thickness direction of the capacitor body, with one of the dielectric layers interposed therebetween and overlapping each other in the thickness direction, and first and second lead portions extending from the first and second body portions toward a side surface of the capacitor body, respectively, and spaced apart from the side surface, and
first and second groove parts extending in the thickness direction, and recessed from the side surface, the first and second lead portions exposed by the first and second groove parts, respectively:
first and second via electrodes disposed in the first and second groove parts, respectively, and connected to the first and second lead portions, respectively, and exposed from surfaces of the capacitor body in the thickness direction which are connected to each other by the side surface;
first and second external electrodes disposed on one of the surfaces of the capacitor body in the thickness direction, and connected to the first and second via electrodes, respectively; and
an insulating layer covering a flat side surface of the first via electrode, a flat side surface of the second via electrode, and the side surface of the capacitor body,
wherein the first groove part is also recessed from one of third and fourth surfaces of the capacitor body in a direction of the capacitor body perpendicular to the thickness direction, the third and fourth surfaces connected to each other by the side surface, and
the second groove part is also recessed from another of the third and fourth surfaces of the capacitor body.

6. The multilayer capacitor of claim 5, wherein the first groove part includes recesses formed in the first lead portions, and the second groove part includes recesses formed in the second lead portions.

7. The multilayer capacitor of claim 5, wherein each of the first and second groove parts has a quarter-cylindrical shape.

8. A board having a multilayer capacitor, the board comprising:
   a circuit board having an upper surface on which first and second electrode pads are disposed; and
   the multilayer capacitor of claim 5, mounted on the circuit board.

9. A multilayer capacitor comprising:
   a capacitor body including dielectric layers, and first and second internal electrodes alternately disposed in a thickness direction of the capacitor body, with one of the dielectric layers interposed therebetween; and
   first and second via electrodes partially embedded in the capacitor body and electrically connected to the first and second internal electrodes, respectively;
   first and second external electrodes disposed on only one of surfaces of the capacitor body in the thickness direction, and connected to the first and second via electrodes, respectively; and
   a first insulating layer covering a side surface of the first via electrode and being in direct contact with a first surface of the capacitor body in a length direction in the capacitor body, and a second insulating layer covering a second surface of the capacitor body in the length direction and being in direct contact with the second surface of the capacitor body in the length direction opposing the first surface,
   wherein the first surface of the capacitor body and the side surface of the first via electrode exposed by the capacitor body are flush with each other, and the second surface of the capacitor body and the side surface of the second via electrode exposed by the capacitor body are flush with each other, and
   each of the first and second via electrodes is exposed from the surfaces of the capacitor body in the thickness direction,
   each of the first internal electrodes is exposed from the first surface of the capacitor body, and is spaced apart from the second surface of the capacitor body and the second via electrode,
   each of the second internal electrodes is exposed from the second surface of the capacitor body, and is spaced apart from the first surface of the capacitor body and the first via electrode,
   a first end of each of the first internal electrodes facing the first surface has a first recess by a first groove part in the body, and
   a second end of each of the second internal electrodes facing the second surface has a second recess a the second groove part in the body.

10. The multilayer capacitor of claim 9, wherein the first and second via electrodes have a semi-cylindrical shape.

* * * * *